United States Patent [19]

Greenwood

[11] 4,414,664
[45] Nov. 8, 1983

[54] WAIT CIRCUITRY FOR INTERFACING BETWEEN FIELD MAINTENANCE PROCESSOR AND DEVICE SPECIFIC ADAPTOR CIRCUIT

[75] Inventor: Edward H. Greenwood, Phoenix, Ariz.

[73] Assignee: Genrad, Inc., Concord, Mass.

[21] Appl. No.: 236,885

[22] Filed: Feb. 23, 1981

[51] Int. Cl.³ .............................................. G06F 11/22
[52] U.S. Cl. ........................................ 371/20; 364/200
[58] Field of Search ............... 371/20; 364/200, 900; 365/222

[56] References Cited

U.S. PATENT DOCUMENTS

| | | | |
|---|---|---|---|
| 4,099,255 | 7/1978 | Stanley et al. | 364/900 |
| 4,142,233 | 2/1979 | Suzuki | 364/200 |
| 4,159,516 | 6/1979 | Henrion et al. | 364/200 |
| 4,308,615 | 12/1981 | Koegel et al. | 371/20 |

*Primary Examiner*—David H. Malzahn
*Attorney, Agent, or Firm*—Cahill, Sutton & Thomas

[57] ABSTRACT

A field maintenance processor including a microprocessor that effects transparent refreshing of a dynamic memory includes a counter circuit which times the duration of the "wait" signal produced by a slow memory or a slow peripheral device accessed by the processor. The counter circuit produces a "wait enable" signal which enables the "wait" signal to produce an "enabled wait" signal that is conducted to a wait input of the processor for only a predetermined time, to ensure transparent refreshing of the entire dynamic memory. If the "wait" signal produced by the slow memory device has not ceased when the predetermined time has elapsed, the "wait enable" signal disappears, causing the "enabled wait" signal also to disappear. The disappearance of the "wait enable" signal also causes a "wait interrupt" signal to be generated and transmitted to the microprocessor, resulting in execution of an interrupt routine to determine which instruction execution was earlier halted in response to the "enabled wait" signal. The entire dynamic memory is transparently refreshed during execution of the interrupt routine.

13 Claims, 8 Drawing Figures

WAIT CIRCUITRY FOR INTERFACING BETWEEN FIELD MAINTENANCE PROCESSOR AND DEVICE SPECIFIC ADAPTOR CIRCUIT

BACKGROUND OF THE INVENTION

1. Field of the Invention

The invention relates to circuitry to testers for testing digital circuits and isolating faults therein.

2. Description of the Prior Art:

U.S. Pat. No. 4,194,113 describes in detail a system for testing digital circuits and isolating faults therein using a "guided probe" approach. As testers in which the described system is embodied have become increasingly popular, it has become desirable to implement lower cost versions of such testers, referred to herein as "field maintenance processors". A field maintenance processor includes a general purpose microcomputer which can implement the guided probe testing operations and can also be used for various other purposes. However, interfacing a general purpose microcomputer to a wide variety of digital systems which need to be "field tested" requires construction of suitable, "custom designed" circuits referred to as "device specific adaptors" to facilitate connection of the digital circuits under test to the field maintenance processor. A digital circuit under test may be a complex, computer-based product which can "take control" of an internal data bus and/or address bus of the field maintenance processor. The device specific adaptors need to have "pluggable connectors" which facilitate physical connection of device specific adaptors to the field maintenance processor.

If the device specific adaptor takes control of the "intenal field maintenance processor (FMP) bus", it is necessary that this be done in such a way as to avoid any loss of information stored in the dynamic memory of the field maintenance processor.

Accordingly, it is an object of the invention to provide a system and method for avoiding the effects of undetected loss of information in a field maintenance processor when a device specific adaptor connected thereto takes control of a bus in the field maintenance processor.

It is very important to the manufacturer of a field maintenance processor that it have extremely high operating reliability, so that users of the field maintenance processor will never have any reason to doubt the results of a particular test. However, buyers of field maintenance processors frequently will design their own device specific adaptors for interfacing between their products to be "field tested" and the field maintenance processor. It is expected that circuit designers who "custom design" their own device specific adaptors will occasionally ignore various timing specifications (which usually are quite conservative) of the field maintenance processor. In the event that a "customer designed" device specific adaptor asserts control over the FMP bus for too long a period of time, this may result in unexplained malfunctions resulting from loss of data stored in the dynamic memory of the field maintenance processor because of the inability of the field maintenance processor to quickly refresh dynamic memories while the device specific adaptor is in control of the internal FMP bus.

Therefore, it is another object of the invention to provide a system and method for preventing a device specific adaptor from taking control of an internal bus of the field maintenance processor for a time period that is so long that the integrity of data stored in dynamic random access memories contained in the field maintenance processor is jeopardized.

SUMMARY OF THE INVENTION

Briefly described, and in accordance with one embodiment thereof, the invention provides a system including a processor which automatically effects transparent refreshing operations on a dynamic random access memory during execution of program instructions and circuitry for generating a "wait" signal when a memory location having a slow excess time is accessed by the processor, and circuitry for generating a "wait enable" signal that is logically ANDed with the "wait" signal to produce an "enabled wait" signal applied to the "wait" input of the processor in order to ensure that the transparent refreshing operation does not fail to refresh any portion of the dynamic random access memory as a result of the "wait" signal having a duration which is too great. In the described embodiment of the invention, the circuitry includes a wait counter circuit having clear, load, and enable inputs and a carry output. A "wait enable" signal is produced in response to the carry output of the wait counter circuit. When the carry signal is "inactive", the "wait enable" signal is "active", enabling the "enabled wait" signal to be produced during accessing of the slow memory. This halts execution of an instruction by the microprocessor during accessing of the slow memory. Termination of the "wait" signal (when the accessing is complete) results in reloading an initial count in the wait counter. The wait counter does not begin counting until the "wait" signal again becomes active. If the carry output of the wait counter circuit becomes "active", the "enabled wait" signal becomes inactive, and an interrupt signal is generated that interrupts the microprocessor, causing it to execute an error routine which both causes refreshing of the entire dynamic random access memory and also alerts an operator by producing information indicating aborting (by the processor) of the instruction halted in response to the "wait" signal. During execution of the interrupt routine, the processor sends a signal to the "wait" counter circuit, thereby "clearing" it.

DESCRIPTION OF THE INVENTION

Figure 1A:
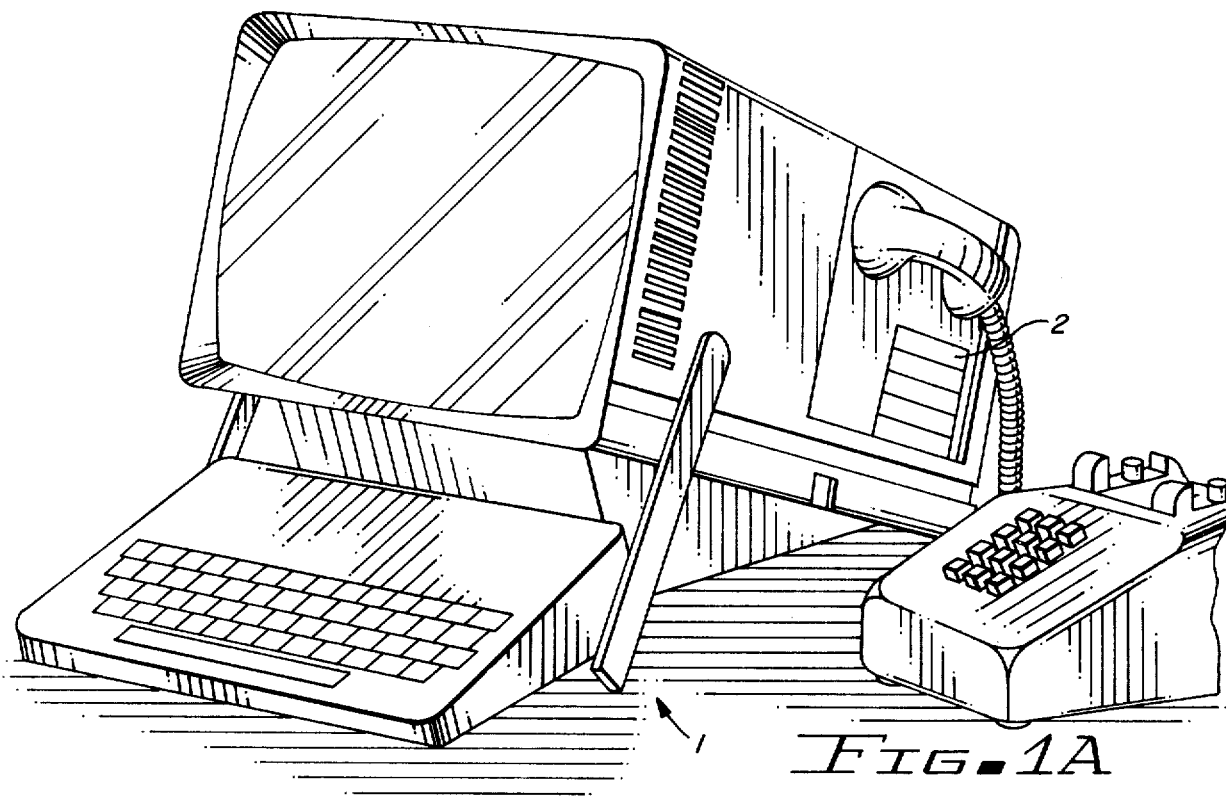
FIG. 1A is a perspective view illustrating the field maintenance processor of the present invention.

Referring now to FIG. 1A, reference numeral 1 designates a field maintenance processor (FMP) which can be used to implement the guided probe fault isolation techniques referred to in U.S. Pat. No. 4,194,113, incorporated herein by reference, for field testing of complex digital electronic products.

As shown in FIG. 1A field maintenance processor 1 includes a cavity 2, referred to as a DSA (device specific adaptor) cavity into which up to four device specific adaptor (DSA) modules can be plugged in order to "interface" between a product under test (PUT) and field maintenance processor 1. A connector (not shown in FIG. 1A) referred to herein as a DSA connector is located in the deepest portion of DSA cavity 2 for receiving edge connectors of printed circuit cards of the above-mentioned device specific adaptors.

Figure 1B:
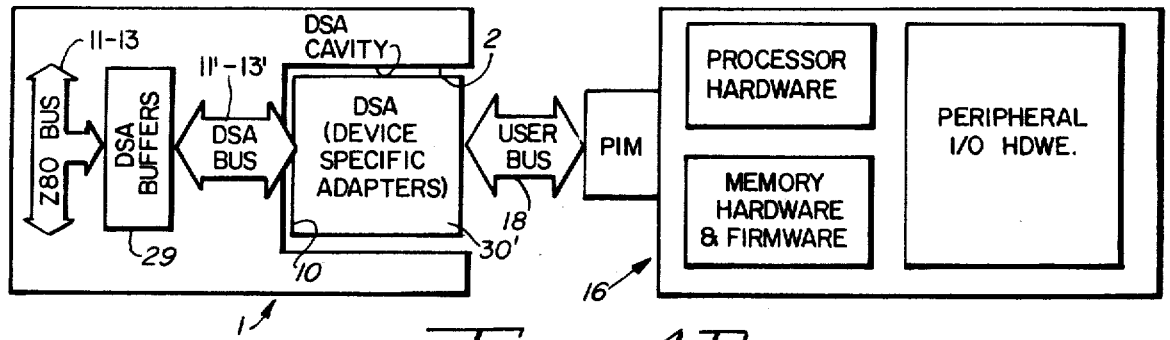
FIG. 1B is a block diagram useful in explaining operation of the field maintenance processor of FIG. 1A.

Referring to FIG. 1B, reference numeral 1 designates the above mentioned field maintenance processor, and reference numeral 2 designates the above-mentioned DSA cavity of field maintenance processor 1. Reference numeral 10 designates the above-mentioned DSA connector. DSA connector 10 is connected to edge connector "terminal strips" of as many as four device specific adaptors which can be plugged therein. The respective DSA connector terminal strips are also connected to corresponding conductors of a bus referred to as DSA bus 11-13'. DSA bus 11-13' is connected to corresponding terminals of bi-directional buffer circuit 29, which can be readily implemented by means of 74LS245 integrated circuit bus transceivers. The corresponding terminals of DSA buffers 29 are connected to corresponding terminals of an "internal" bus 11-13 occasionally referred to herein as the "Z80 bus". Internal bus 11-13 includes both bi-directional address bus lines and bi-directional data bus lines.

In FIG. 1B, reference numeral 16 designates a product under test (PUT) by field maintenance processor 1. Typically, product under test 16 may include circuits, such as a processor and direct memory address (DMA) circuit, both of which are capable of taking control of the Z80 bus. Product under test 16 is coupled to device specific adaptor 30' by means of a "user bus" 18 that conducts various signals between device specific adaptors 30' and product under test 16. A product interface module (PIM) may, if necessary, be connected between user bus 18 and product under test 16. (For example, it may be desirable for the user to design a particular device specific adaptor or group thereof to interface between field maintenance processor 1 and an entire "family" of related products, each of which is different, and requires somewhat different interfacing to the subject device specific adaptor. In this case, it is convenient to devise a number of different PIM's to interface between the user bus 18 and the various products of the product family.)

In use, field maintenance processor 1 enables a user to design a device specific adaptor (such as 30') that interfaces between user bus 18 and digital product under test (PUT) 16, which is to be tested using the guided probe or other suitable testing algorithm stored in the memory of field maintenance processor 1. For further details on an algorithm that can be stored and executed by field maintenance processor 1, see U.S. Pat. No. 4,194,191 issued Mar. 18, 1980 by Fulks et al. and U.S. Pat. No. 4,174,805 issued Nov. 20, 1979 by Fulks et al., both of the foregoing patents being incorporated herein by reference.

It can be seen that the function of device specific adaptor circuit 30' is to function as a "personality circuit" which performs the necessary operations on signals received from DSA bus 11-13' and transmitted to user bus 18, and vice-versa, to allow information to be transmitted back and forth between field maintenance processor 1 and product.

Figure 1C:
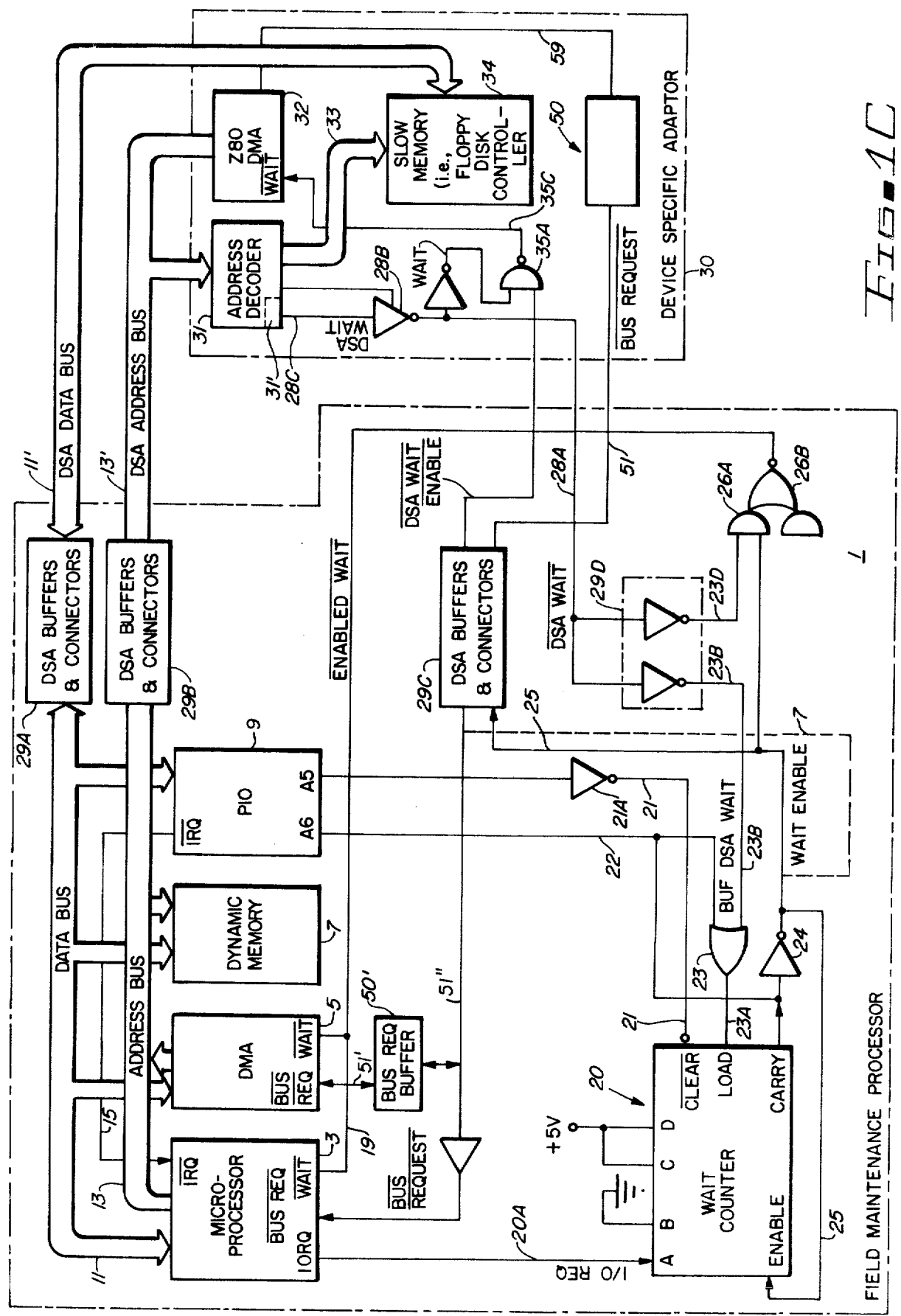
FIG. 1C is a block diagram illustrating a portion of the circuitry of the field maintenance processor of FIGS. 1A and 1B.

Referring now to FIG. 1C, field maintenance processor 1 includes a microprocessor 3, which may be implemented by means of a Z80 integrated circuit 8 bit microprocessor. The part number of a version of microprocessor 3 manufactured by Mostek, Inc. is the MK3380-4 N-Channel 8 bit microprocessor. Field maintenance processor 1 also includes a direct memory addressing (DMA) circuit 5, which may be implemented by means of Mostek MK3883-4 DMA integrated circuit. Field maintenance processor 1 also includes an approximately 128 kilobyte dynamic memory 7, which can be implemented by means of a plurality of Mostek MK4116 MOS dynamic RAM integrated circuits. Field maintenance processor 1 further includes a parallel input/output (PIO) circuit 9, which may be implemented by means of a Mostek MK3881-4 integrated PIO circuit.

A 16 line address bus 13 is connected to the address output ports of microprocessor 3, DMA circuit 5 and also to the address input ports of dynamic memory 7. Each conductor of bi-directional eight bit data bus 11 is is connected to respective corresponding ones of eight data terminals of microprocessor 3, DMA circuit 5, dynamic memory 7, and PIO circuit 9. An interrupt request line 15 is connected to the $\overline{IRQ}$ input of microprocessor 3 and the $\overline{IRQ}$ output of PIO circuit 9.

A "wait" conductor 19 is connected to the $\overline{WAIT}$ input terminals of microprocessor 3 and DMA circuit 5, respectively. The eight conductors of bi-directional data bus 11 are connected to corresponding terminals of bi-directional buffer circuits 29A, which can be implemented by means of 74LS245 Bus transceiver integrated circuits, manufactured by Texas Instruments and others. The individual bi-directional buffer circuits have terminals connected to corresponding lines of DSA data bus 11'. Similarly, the conductors of address bus 13 are coupled by means of bi-directional buffer circuits, collectively designated by reference numeral 29B, to corresponding conductors of DSA address bus 13'. It should be noted that all connections between field maintenance processor 1 and device specific adaptor 30 are made by means of the above-mentioned DSA connector, designated by reference numeral 10 in FIG. 1B, and also incorporated in blocks 29A-C of FIG. 1C. The letters "DSA" are added to the name of each conductor on the "device specific adaptor side" of the DSA buffers and connectors 29A, 29B and 29C.

Still referring to FIG. 1C, device specific adaptor 30 includes an address decoder 31. Address decoder 31 can be implemented easily by any suitable decode circuit, such as a PAL16L4 programmable array logic integrated circuit manufactured by Monolithic Memories, Inc. Block 31' of address decoder 31 contains a timer circuit (not shown, but easily implementable by those skilled in the art) for generating a DSA WAIT signal on conductor 28C. If the storage location being accessed by microprocessor 3 has an access time of more than 250 nanoseconds, timer circuit 31' must generate the DSA WAIT signal, which is inverted by inverter circuit 28B to produce a $\overline{\text{DSA WAIT}}$ signal on conductor 28A. A wide variety of suitable timer circuits can be easily used by one skilled in the art to sense the beginning of a fetch cycle (by detecting a transition of conductors of DSA address bus 13' and generating the DSA WAIT signal if the access time of the accessed storage location is greater than, for example, 250 nanoseconds), as required by the MK3380-4 microprocessor mentioned above.

In accordance with the invention, a wait counter 20 and associated circuitry are provided in field maintanence processor 1 to respond to any $\overline{\text{DSA WAIT}}$ signal that is received from device specific adaptor 30, by beginning timing of the duration of the $\overline{\text{DSA WAIT}}$ signal and generating a WAIT ENABLE signal on conductor 25. This WAIT ENABLE signal is utilized to generate the wait signals applied by means of conductor 19 to the $\overline{\text{WAIT}}$ inputs of microprocessor 3 and DMA circuit 5.

Wait counter 20 can be implemented by means of a 74LS161 loadable counter, which is manufactured by various semiconductor manufacturers. Wait counter 20 includes four "load" inputs labeled, A,B,C, and D. Load inputs C and D are connected to the positive supply to produce logical "ones" thereon, and load input B is connected to ground to produce a logical "zero" thereon. Load input A is connected to an "input-/output request" conductor 20A, which conducts an I/O request signal generated by microprocessor 3.

As is known by those skilled in the art, the Z80 microprocessor addresses input/output ports separately from memory locations, and applies a low level to conductor 20A when a I/O request is being made and a high level when a memory request is being made. This causes either a "zero" or a "one" to be loaded into the least significant bit of wait counter 20, depending upon whether it is a memory cycle or an I/O cycle that is being executed. This information is needed (since the delay times are different for memory and I/O cycles) to preload corresponding starting counts into wait counter 20.

A "$\overline{\text{CLEAR}}$" input of wait counter 20 is connected by means of conductor 21 and inverter 21A to a port bit A5 of PIO circuit 9; port bit 5A is programmed as an output.

A "LOAD" input of wait counter 20 is connected to conductor 23A, which is connected to the output of OR gate 23. A low level on conductor 23A causes the logic levels of inputs A, B, C and D to be loaded into wait counter 20 and inhibits counting as long as conductors 23A is low.

One input of OR gate 23 is connected to conductor 22, which is connected to the port bit A6 (which is programmed as an input) of PIO circuit 9. Conductor 22 is also connected to the "CARRY" output of wait counter 20, which generates a high logic level on conductor 22 when the logical state 1111 is attained by wait counter 20 (as it is incremented). Conductor 22 is connected to the input of inverter 24, the output of which is connected to conductor 25. The signal produced on conductor 25 is referred to as the "WAIT ENABLE" signal. Conductor 25 applies the WAIT ENABLE signal to the "ENABLE" input of wait counter 20 and also to one input of two input AND gate 26A.

A second input of OR gate 23 is connected to the output of an inverter contained in block 29D. The input of that inverter is connected to conductor 28A, which conducts the above-mentioned $\overline{\text{DSA WAIT}}$ signal produced by device specific adaptor 30 if an access is being made by field maintenance processor 1 to a slow memory 34 (such as a memory of a floppy disk controller).

The signal on conductor 23B is referred to as the "BUFFERED DSA WAIT" signal. That signal is applied to the other input of OR gate 23. The output of AND gate 26A is applied to one input of NOR gate 26B, the output of which is connected to $\overline{\text{WAIT}}$ conductor 19. $\overline{\text{WAIT}}$ conductor 19 is connected to the $\overline{\text{WAIT}}$ inputs of microprocessor 3 and DMA circuit 5. (The other input of NOR gate 26B is connected to circuitry, which is irrelevant to the wait enable counter 20 and circuitry associated therewith and therefore is not shown in FIG. 1C). The $\overline{\text{DSA WAIT}}$ signal on conductor 28A is inverted by one of inverters 29D and the result is ANDed with the WAIT ENABLE signal on conductor 25 by AND gate 26A and inverted by NOR gate 26B to produce an $\overline{\text{ENABLED WAIT}}$ signal on conductor 19.

Before describing the operation of the circuitry of FIG. 1C in detail, certain aspects of the operation of the Z80 microprocessor 3 should be understood.

The Z80 microprocessor executes instructions by stepping through a few basic operations including memory read or write, I/O device read or write, and interrupt acknowledge operations. All such instructions are merely a series of these basic operations. Each of the basic operations can take from there to six clock periods to complete or they can be lengthened to synchronize the microprocessor to the speed of external devices accessed by microprocessor 3. The basic clock periods are referred to as "T states" and the basic operations are referred to as "M (machine) cycles". A typical instruction will be merely a series of specific M and T cycles. For example, an instruction may consist of three machine cycles (M1, M2 and M3). The first machine cycle of any instruction is a fetch cycle which is four, five or six "T states" long (unless lengthened by the wait signal). The fetch cycle M1 is used to fetch the OP code of the next instruction to be executed. Subsequent machine cycles move data between the micrprocessor and memory or I/O devices and they may have anywhere from three to five T cycles. (Again they may be lengthened by wait states to synchronize the external devices to the microprocessor.)

Figure 4A:
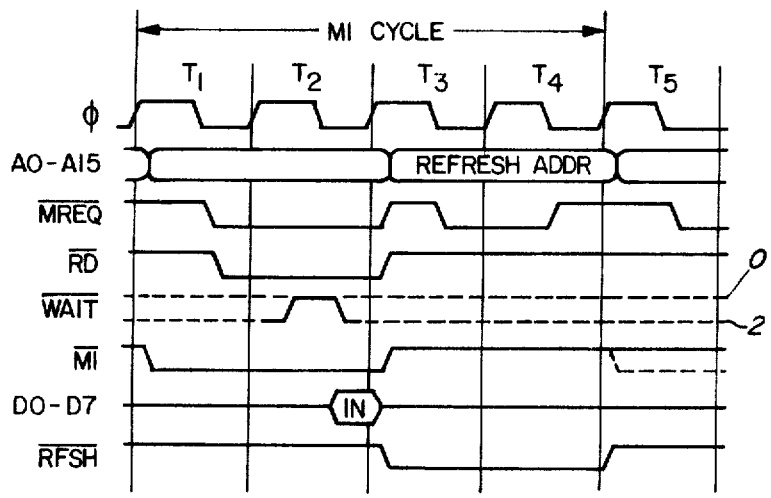
FIG. 4A is a timing diagram useful in explaining the operation of the microprocessor of the circuit of FIG. 1C.

FIG. 4A shows the timing during an M1 cycle (OP code fetch). The program counter contents are placed on the address bus at the beginning of the M1 cycle. One-half clock time later the $\overline{\text{MREQ}}$ signal goes active (i.e., low). At this time the address to the memory has had time to stabilize so that the falling edge of $\overline{\text{MREQ}}$ can be used directly as a chip enable clock to dynamic memories. The $\overline{\text{RD}}$ line also goes active to indicate that the memory read data should be enabled onto the data bus. The microprocessor samples the data from the memory on the data bus with the rising edge of the clock of state T3 and this same edge is used by the microprocessor to turn off the $\overline{\text{RD}}$ and $\overline{\text{MREQ}}$ signals. Thus, the data has already been sampled by the microprocessor before the $\overline{\text{RD}}$ signal becomes inactive.

Clock states T3 and T4 of a fetch cycle are used to refresh dynamic memories. The microprocessor uses this time to decode and execute the fetched instruction, so no other operation could be performed at this time anyway. During T3 and T4 the lower bits of the address bus contain a memory refresh address and the RFSH signal becomes active to indicate that a refresh read of all dynamic memories should be accomplished. Notice that a $\overline{RD}$ signal is not generated during refresh time to prevent data from different memory segments from being gated onto the data bus. The $\overline{MREQ}$ signal during refresh time should be used to perform a refresh read of all memory elements. The refresh signal can not be used by itself since the refresh address is only guaranteed to be stable during $\overline{MREQ}$ time.

Thus, it is seen that the Z80 generates "transparent" memory refresh signals during the T3 and T4 time slots of an M1 (op code fetch) cycle. Consequently, the Z80 microprocessor can be utilized in conjunction with dynamic memories without the requirement of providing additional hardware and software dedicated to keeping the dynamic memories refreshed. This reduces system complexity and cost.

Figure 4B:
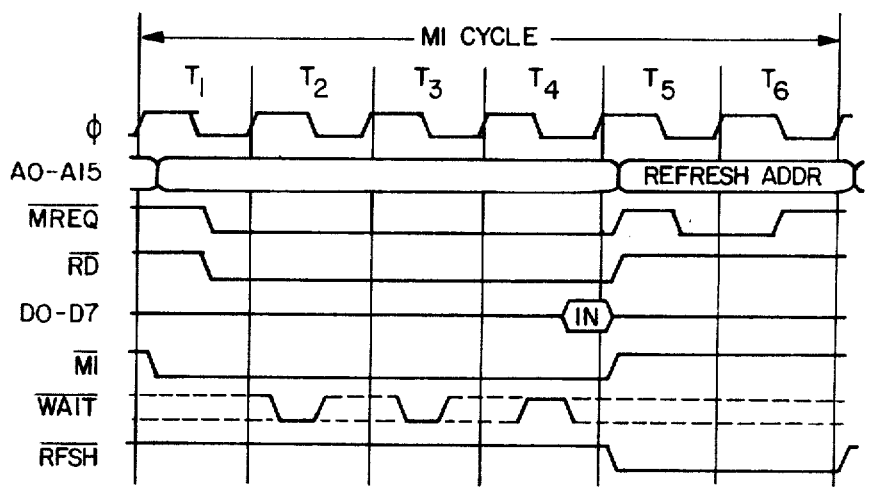
FIG. 4B in another timing diagram useful in explaining the operation of the microprocessor of the circuit of FIG. 1C.

FIG. 4B illustrates how the fetch cycle is delayed if the memory activates that $\overline{WAIT}$ line (by bringing it low). During T2 and every subsequent state Tw, the microprocessor samples the $\overline{WAIT}$ line with the falling edge of $\phi$. If the $\overline{WAIT}$ line is active at this time, another wait state will be entered during the following cycle. Using this technique the read cycle can be lengthened to match the access time of any type of memory device.

It should be noted that when the wait signal is low on the Z80, the Z80 is incapable of responding to interrupts or "releasing" the bus for DMA control. The effect of the wait line being active during T2 is that the entire Z80 microprocessor is "frozen" until the next T period.

Figure 4C:
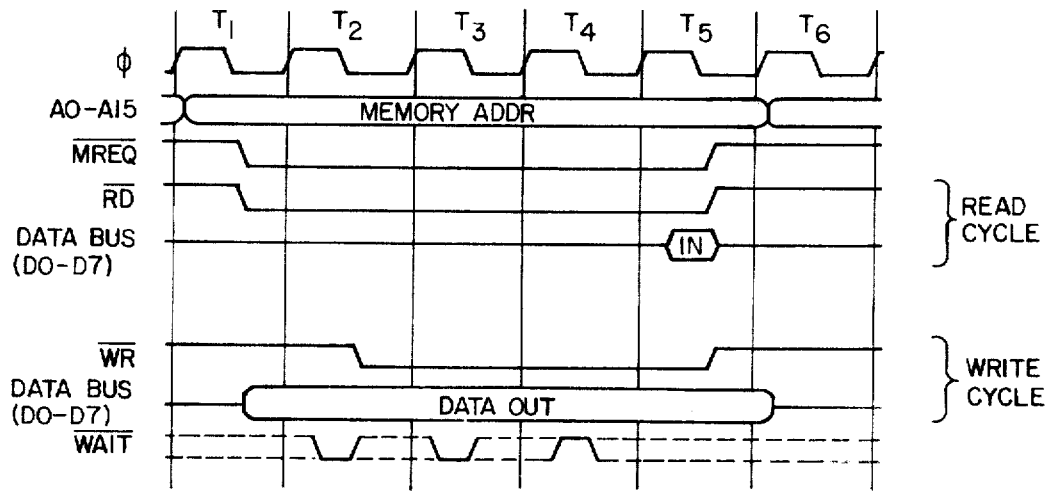
FIG. 4C is another timing diagram useful in explaining the operation of the microprocessor of the circuit of FIG. 1C.

FIG. 4C illustrates the timing of memory read or write cycles other than an OP fetch (M1 cycle). The cycles are generally three clock periods long unless wait states are required by the memory via the $\overline{WAIT}$ signal. The $\overline{MREQ}$ signal and the $\overline{RD}$ signal are used the same as in the fetch cycle. In the case of a memory write cycle, the $\overline{MREQ}$ also becomes active when the address bus is stable so that it can be used directly as a chip enable for dynamic memories. The $\overline{WR}$ line is active when data on the data bus is stable so that it can be used directly as a read/write pulse to virtually any type of semiconductor memory. The $\overline{WR}$ signal goes inactive of a half T state before the address and data bus contents are changed so that the overlap requirements for most semiconductor memory devices will be met.

Note that fetched data must be available on the Z80 microprocessor data bus by the T3 time frame of a memory read cycle. During time frames T3 and T4 the Z80 is simultaneously decoding the fetched op code and generating the refresh addresses and refresh signal. Note that if the fetched data will not be available on the data bus by T3, it is necessary for the memory to generate a WAIT cycle to lengthen the memory read cycle until the fetched data is available on the data bus.

FIG. 4C also illustrates how a $\overline{WAIT}$ request signal will lengthen any memory read or write operation. This lengthening is identical to that previously described for a fetch cycle. (Notice in this fiqure that a separate read and a separate write cycle are shown in the same figure, although read and write cycles can never occur simultaneously).

To summarize the foregoing, the Z80 microprocessor 3 has the capability of providing a "transparent refresh" operation for refreshing dynamic memory 7. If product under test 16 (FIG. 1B) has a memory which is sufficiently slow that, under worst case conditions, the transparent refresh capability of microprocessor 3 will fail to result in complete refreshing of dynamic memory 7 within a specified time, memory information stored in dynamic memory 7 will be lost. If microprocessor 3 executes a fetch cycle, it must receive the fetched data within a certain time. Otherwise, microprocessor 3 will not be able to properly accept the fetched data. For the MK3880-4, the fetched data must be available on Z80 bus 11-13 (FIG. 1B) within 250 nanoseconds after the beginning of the fetch cycle.

Since the information storage registers or other storage devices in device specific adaptor 30' or in product 16 frequency have access times which may be greater than 250 nanoseconds, it is necessary that device specific adaptor 30 automatically generate a "wait" signal to stop microprocessor 3 any time microprocessor 3 accesses a slow (greater than 250 nanoseconds) memory location of device specific adaptor 30. The $\overline{DSA\ WAIT}$ signal on conductor 28A of FIG. 1C is such a signal.

The above-mentioned "wait" signal then is used to temporarily "freeze" microprocessor 3 until the data being fetched from the slow memory appears on Z80 bus 11-13. Microprocessor 3 then continues execution of the current read or write cycle.

The operation of wait counter 20 (and its associated circuitry) in conjunction with slow memory 34 (FIG. 1C) in the system shown in FIG. 1C will now be described. For purposes of illustration, it will be assumed that microprocessor 3 accesses slow memory 34 of device specific adaptor 30, and that memory 34 is too slow to have the fetched data available on data bus 11 by T3 of the memory read cycle. Circuit 31' therefore generates a $\overline{DSA\ WAIT}$ signal on conductor 28A, causing it to go to a low level i.e., to become "active". This causes a BUFFERED DSA WAIT signal on conductor 23B to go to a high level. The output 23A of OR gate 23 then is forced to a high level.

This causes wait counter 20 to begin incrementing from the pre-load initial state specified by the A, B, C and D inputs until (a) wait counter 20 contains all "ones" (at which time the CARRY output goes to a high level), forcing a high level on conductor 22, or (b) the $\overline{DSA\ WAIT}$ signal on conductor 28A goes to a high level (i.e., becomes inactive). Wait counter 20 becomes "locked" into a non-counting mode as soon as its CARRY output goes high.

If the $\overline{DSA\ WAIT}$ signal on conductor 28A goes high before a CARRY signal is generated by wait counter 20, the BUFFERED DSA WAIT signal on conductor 23B goes low, and the LOAD signal on conductor 23A goes low, reloading the initial state specified by inputs A, B, C and D into wait counter 20. Wait counter 20 remains in this state until the LOAD signal on conductor 23A goes high again. The high $\overline{DSA\ WAIT}$ signal on conductor 28A also causes a low level to be produced on conductor 23D. This causes an $\overline{ENABLED\ WAIT}$ signal on conductor 19 to go from a low level (active) to a high level (inactive), enabling microprocessor 3 to continue executing the present cycle, which was temporarily halted when the $\overline{ENABLED\ WAIT}$ signal on conductor 19 went to a low (active) level.

If the CARRY signal on conductor 22 is forced high because wait counter 20 "times out" (i.e., contains all "ones"), then the LOAD signal on conductor 23A remains high, and the WAIT ENABLE signal on conductor 25 goes low, disabling wait counter 20 from further counting. The high CARRY signal on conductor 22 also produces a "one" at the A6 input of PIO circuit 9.

PIO circuit 9 is programmed to responds to the "one" as the A6 input by producing a low signal on the $\overline{IRQ}$ conductor 15, thereby interrupting processor 3. The low WAIT ENABLE signal on conductor 25 also causes the $\overline{\text{ENABLED WAIT}}$ signal on conductor 19 to go from a low (active) level to a high (inactive) level, allowing microprocessor 3 to execute a "wait interrupt" routine in response to the above-mentioned interrupt signal on conductor 15.

In the case of executing the "wait interrupt" routine, microprocessor 3 transmits information to PIO circuit 9, causing it to produce a high level on its A5 terminal. This produces a low pulse on conductor 21, which clears wait counter 20. This causes the high CARRY level on conductor 22 to fall to a low level. The low level on conductor 22 is applied to an input of OR gate 23, causing a low level to be produced on conductor 23A. This loads the initial value presently specified by the A,B,C and D inputs of wait counter 20. Thus, wait counter 20 is in effect, "reset" and is now ready to respond in the manner described above to another $\overline{\text{DSA WAIT}}$ signal generated by device specific adaptor 30.

The effect of the above described operation is to cause an abort operation by microprocessor 3 if device specific adaptor 30 attempts to generate a $\overline{\text{DSA WAIT}}$ signal which is to long to allow refreshing of the entire dynamic memory 7 within a predetermined time under worst case conditions.

This will be understood after the wait interrupt routine executed by microprocessor 3 is described. It should be noted that in the course of executing the wait interrupt routine, enough memory cycles are executed by microprocessor 3 to cause generation of the 128 transparent refresh read cycles necessary to refresh the entire dynamic memory 3 in substantially less than the 2 millisecond specification of the dynamic random access memory chips of which dynamic memory 7 is composed.

Figure 3:
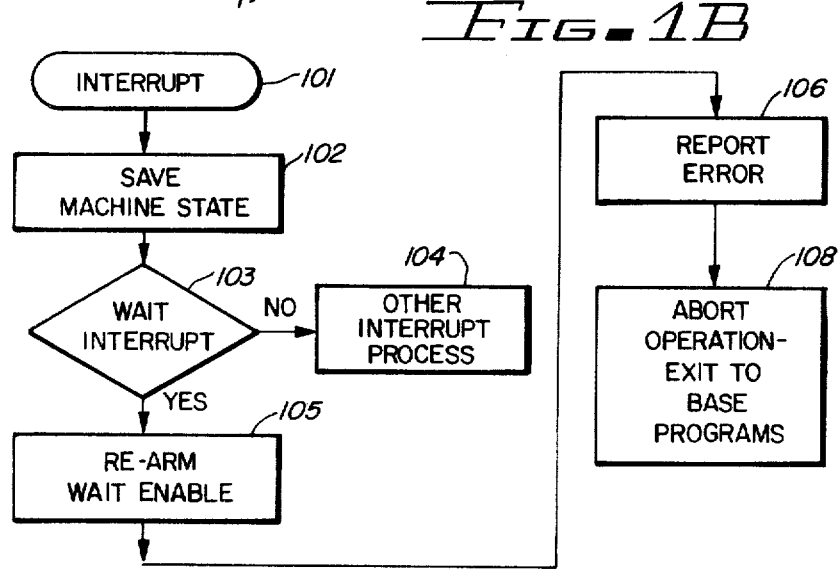
FIG. 3 is a flow chart of an interrupt routine executed by the microprocessor of FIG. 1C in response to a wait signal generated by a device specific adaptor.

The interrupt subroutine that is generated in response to a positive transition of the CARRY signal produced by wait counter 20 is shown in FIG. 3, and is entered via label 101. First, the program saves the contents of the various working registers and flag registers of the microprocessor 3 in dynamic memory 7. (This is an entirely conventional step which is always performed by a processor at the beginning of any interrupt routine. Therefore, the detailed steps of the "save" operation are not set forth in detail.)

Then the program enters decision block 103 and determines if the interrupt which generated the vector is a "wait" interrupt or some other type of interrupt. If it is some other type of interrupt, the program goes to block 104 and executes an interrupt routine corresponding to the "other" type of interrupt. (Note that decision block 103 is necessary only if the system has two different types of interrupts which generate the same interrupt vector.)

In block 105, the program causes microprocessor 3 to cause PIO circuit 9 to generate a "reset" signal on the A5 output of PIO circuit 9 in order to clear (i.e., reset) wait counter 20. This causes the CARRY output of the wait counter 20 to generate a "low" logic level which is inverted by inverter 24 to produce the WAIT ENABLE signal. This enables wait counter 20 to be "loaded" to the initial state (1100 or 1101) determined by I/O request line 20A and to begin counting as soon as a BUFFERED DSA WAIT signal is produced on conductor 23B in response to the $\overline{\text{DSA WAIT}}$ signal.

Wait counter 20 then is incremented until the above-mentioned CARRY signal is produced.

Next, the program enters block 106 and causes an error (too long a $\overline{\text{DSA WAIT}}$ signal) to be "reported". This can include sending out an error message to a CRT display unit. In block 108, the program executes an abort operation, which essentially "freezes" the system and waits for human intervention.

Reporting the error, as indicated in block 106, includes loading an error routine which effects printing of an error message and printing of the machine state at which the error occurred, i.e., the address of the instruction being executed at that time. The operator can then try suitable remedial action, for example, removing the device specific adaptor with which the error occurred and substituting another identical one.

It should be noted that in order to allow either DMA circuit 5 or DMA circuit 32 of FIG. 1C to take control of the data bus 11 (and address bus 13), it is necessary for the DMA circuit (or any other circuit that desires to take control of the bus) to first monitor the status of a bus request line connected to a bus request terminal of the monitoring circuit. If the bus request line is low, this means that another circuit has control of the data bus and address bus, and it therefore is unavailable. No circuit in the system can assert control over the data and address buses when they are unavailable. However, if the bus request line is high, this means the data bus and address bus are presently available.

Figure 2:
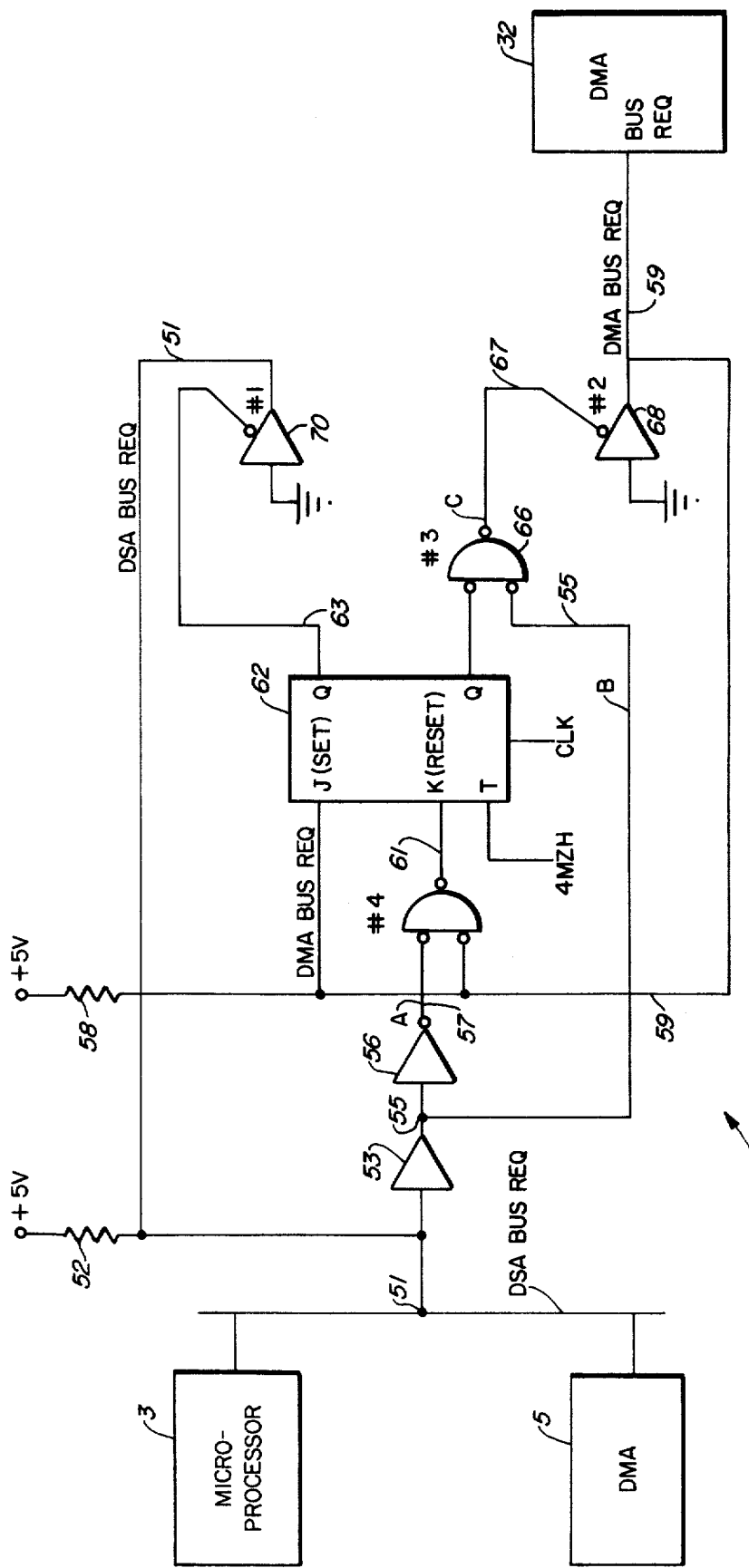
FIG. 2 is a schematic diagram illustrating buffer circuitry for a bus request conductor used in the system of FIGS. 1A and 1B.

It should be noted that the bus request line connected to the Z80 DMA circuit 5 and Z80 microprocessor chip 3 is a bi-directional line. Unfortunately, there is no signal which indicates which direction information on the bus request line is going. This makes it very difficult to "buffer" the bus request line because it is not known whether to buffer the bus request line from the Z80 DMA chip as an output thereof or to buffer the request line to the Z80 DMA chip as an input thereof. Stated differently, buffering of the bus request line by connecting bi-directional buffer circuits in series with the bus request line is desirable for several reasons. First, the current driving capability of the bus request outputs of the DMA circuits 5 and 32 of FIGS. 1C and 2 is not great enough to drive a large bus request line capacitance at a suitable rise time rate.

Second, in the system shown in FIG. 1C, the bus request line 51' of field maintenance processor 1 is coupled directly to the bus request terminals of both microprocessor 3 and DMA circuit 5. It would not be desirable to connect the $\overline{\text{BUS REQ}}$ terminals of microprocessor 3 and DMA circuit 5 directly to the DSA connector 10 (FIG. 1B), since device specific adaptor 30 is also plugged directly into DSA connector 10, since it is possible that static electric charge present on the bus request conductor of device specific adaptor 30 is great enough to destroy the sensitive MOS input circuitry of microprocessor 3 and DMA circuit 5.

Provision of suitable buffering circuitry in series with the $\overline{\text{BUS REQ}}$ conductors between the DSA connector 10 and the bus request terminals of microprocessor 3 and DMA chip 5 could solve both of the above problems, if there were available control signals indicating whether the DMA chips 5 and 32 and other circuits wishing to assert control over the data bus are monitoring or driving the bus request line.

Buffer circuit 50' in FIG. 1C performs the function of buffering the $\overline{\text{BUS REQ}}$ input of DMA circuit 5 and conductor 51' from conductor 51", which is connected by means of a buffer circuit contained in circuit 29C and part of the above mentioned DSA connector also contained in circuit 29C to conductor 51. Buffer circuit 50 is substantially similar to buffer circuit 51'. Buffer circuit 50 is shown in detail in FIG. 2.

In accordance with the present invention, the circuit of FIG. 2 includes a flip-flop which "examines" the bus request line, determines whether or not it is being asserted by any circuit capable of doing so, and stores a corresponding level indicating whether the DMA chip is monitoring or driving the bus request line. The contents of this flip-flop can then be used to control the direction of the buffer circuitry for the bus request line.

Referring still to FIG. 2, a DSA bus request conductor 51 is connected to or coupled by means of suitable buffers to the bus request inputs of all devices in the system which are capable of asserting control over the address bus 13, 11 including, microprocessor 3, DMA circuit 5 and DMA circuit 32.

DSA bus request conductor 51 is connected to a pullup resistor 52, which is connected to a positive 5 volt power supply voltage, and is also connected to the input of a three-state buffer 53.

The output of three-state buffer 53 is connected by means of conductor 55 to the input of an inverter 56 and to one input of two input AND gate 66. The output of inverter 56 is connected to one input of two input AND gate 60, the output of which is connected to the $\overline{K}$ input of J-K flip-flop 62. The other input of two input AND gate 60 is connected by means of conductor 59 to a pull-up resistor 58 and to the bus request terminal of DMA circuit 32. The signal on conductor 59 is referred to as $\overline{\text{DMA BUS REQUEST}}$.

Conductor 59 is also connected to the J input of J-K flip-flop 62. The Q output of flip-flop 62 is connected by means of conductor 63 to an enable input of three-state buffer 70. The input of three-state buffer 70 is connected to a ground level supply voltage conductor, and the output thereof is connected to conductor 51, on which the internal $\overline{\text{DSA BUS REQUEST}}$ signal is conducted. The $\overline{Q}$ output of flip-flop 62 is connected by means of conductor 64 to the other input of two input AND gate 66. The output of AND gate 66 is connected by means of conductor 67 to the enable input of three-state buffer 68. The input of three-state buffer 68 is connected to a ground level voltage conductor and its output is connected to conductor 59.

The operation of the circiut of FIG. 2 is as follows:

First, assume that DMA chip 32, which is part of the DSA circuit 30 is monitoring the status of the $\overline{\text{DSA BUS REQUEST}}$ conductor 51, which is connected to the Z80 microprocessor 3 of the FMP 1. Also, assume that the flip-flop 62 is initially set. (The reason for this assumption will be clear later.) When flip-flop 62 is set, this means that DMA circuit 32 is monitoring the $\overline{\text{DMA BUS REQUEST}}$ conductor 59, as can be seen by assuming that a logical "one" is applied to $\overline{\text{DSA BUS REQUEST}}$ conductor 51 to indicate that no other device in the system is exerting control over the data bus. This logical "one" is produced on conductor 51 by pull-up resistor 52, since no other device is pulling conductor 51 low because no other device is asserting control over busses 11 and 15. The fact that flip-flop 62 is initially set causes a "one" to be applied via conductor 64 to the control input of three-state inverter 70, disabling three-state inverter 70, and thereby allowing pull-up resistor 52 to pull conductor 51 to a "one" level.

Then conductor 55 will be at a logical one, and conductor 57 will be at a logical "zero".

Since flip-flop 62 is in a "set" state, the $\overline{Q}$ output conductor 64 will be at a logical "zero". Thus, one input of gate 66 is at a logical "zero" and the other input is at a logical "one". The output of gate 66 therefore is at a logical "one" causing three-state buffer 68 to be off. This means it presents a very high output impedance. The voltage on $\overline{\text{DMA BUS REQUEST}}$ conductor 59 is therefore a logical "one" due to the action of pull-up resistor 58. Since at least one input of gate 60 is at a logical "one", its output, conductor 61, is at a logical "one". Thus, flip-flop 62 remains set (since $\overline{K}$ must be a "zero" to reset flip-flop 62).

It should be noted that the truth table for logic gates 60 and 66 is as follows:

| INPUT 1 | INPUT 2 | OUTPUT |
| --- | --- | --- |
| 0 | 0 | 0 |
| 0 | 1 | 1 |
| 1 | 0 | 1 |
| 1 | 1 | 1 |

Next, assume that an external device, such as DMA circuit 5 (FIG. 1) "takes control" of the address bus and data bus. DAM circuit 5 is then required to apply a logical "zero" on $\overline{\text{DSA BUS REQUEST}}$ conductor 51. This results in a logical "zero" on conductor 55 and a logical "one" on conductor 57. Conductor 61 remains at a logical "one", so the output of gate 60 remains a logical "one", and therefore the state of flip flop 62 is not changed. Thus, both inputs of gate 66 are logical "zeros". As can be seen from the above truth table, conductor 67 assumes a logical "zero", turning on three-state buffer 68 to produce a logical "zero" on $\overline{\text{DMA BUS REQUEST}}$ conductor 59. It will readily be apparent that this (the "zero" on conductor 59) produces no change on the $\overline{K}$ input of flip-flop 62, which thus remains "set".

Thus, we see that for either a logical "one" or a logical "zero" applied to $\overline{\text{DSA BUS REQUEST}}$ conductor 51, that state will be reproduced on $\overline{\text{DMA BUS REQUEST}}$ conductor 59 when DMA circuit 69 is in its "monitoring" mode, which occurs when flip-flop 62 is in its "set" state.

Next, it is helpful to consider the operation of the circuit of FIG. 2 when DMA circuit 32 itself applies a logical "zero" to $\overline{\text{DMA BUS REQUEST}}$ conductor 59 in order to exert control over the data bus (after having determined that the data bus is indeed available).

In this event, DSA BUS REQUEST conductor 51 is initially at a logical "one". Conductor 57 is at a logical "zero" and conductor 55 is at a logical "one". Since both conductors 57 and 59 are now at logical "zeros", the above truth table indicates that gate 60 produces a logical "zero" on conductor 61, the $\overline{K}$ input to flip-flop 62. This causes flip-flop 62 to "reset". This cause Q conductor 63 to go from a logical "one" to a logical "zero", turning three state non-inverting buffer 70 on, and forcing $\overline{\text{DSA BUS REQUEST}}$ conductor 51 to a logical "zero" to "request the bus" and inform the rest of the system that the address and data buses are not available.

This causes conductor 55 to go to a logical "zero" and in turn causes conductor 57 to go from a logical "zero" to a logical "one". This causes conductor 61 to go from a logical "zero" to a logical "one", thereby preventing further resetting of flip-flop 62. Meanwhile, Q output conductor 64 of flip-flop 62 has gone from a logical "zero" to a logical "one". The output of gate 66 causes conductor 67 to remain at a logical "one", maintaining three state non-inverting buffer 68 off.

Thus, it is seen that when DMA circuit 32 exerts a logical "zero" on DMA BUS REQUEST conductor 59 in order to assert control over the bus, the same logic "zero" level is forced onto DSA BUS REQUEST conductor 51, "requesting the bus" and informaing the rest of the system that the bus is now unavailable.

Next, it is instructive to explain the operation of the circuit of FIG. 2 when DMA circuit 32 released control of the data bus by allowing DMA BUS REQUEST conductor 59 to return from the logical "zero" to a logical "one" under the influence of pull-up resistor 58. It will be recalled that at the beginning of this process, conductor 57 is at a logical "one", since DSA BUS REQUEST conductor 51 had been held low (as previously explained), while DMA circuit 32 was exerting control over the data and address buses. With conductor 59 and conductor 57 both at logical "ones", the output of gate 60 remains at a logical "one". The logical "one" on conductor 59, applied to the J input of flip-flop 62, now causes flip-flop 62 to be "set", so that Q conductor 63 goes from a logical "zero" to a logical "one", turning off three-state non-inverting buffer 70. This allows pull-up resistor 52 to pull DSA BUS REQUEST conductor 51 to go from a logical "zero" to a logical "one", indicating to the rest of the system that the data bus and address are now available. Q conductor 64 goes from a logical "one" to a logical "zero", and the other input (conductor 55) goes from a logical "zero" to a logical "one". The output of gate 66 remains at a logical "one" and three-state non-inverting buffer 68 remains off, so that DMA BUS REQUEST conductor 59 remains at a logical "one" due to the action of pull-up resistor 58.

While the invention has been described with reference to a particular embodiment thereof, those skilled in the art will be able to make various modifications to the disclosed embodiment without departing from the true spirit and scope of the invention.

I claim:

1. In a system including a dynamic random access memory and a processor which automatically effects transparent refresh operations on said dynamic random access memory during execution of program instructions in order to ensure refreshing of all locations of said dynamic random access memory, said system being capable of accessing a slow memory circuit having the characteristics that it generates a first wait signal if the access time of said slow memory circuit exceeds a predetermined amount of time, the improvement comprising in combination:

(a) counting means for counting from a first count to a second count in response to said first wait signal and producing a wait enable signal if said second count is attained by said counting means;

(b) a first wait signal conductor for conducting said first wait signal from said slow memory circuit if it has been addressed by said processor, said slow memory circuit being required to generate said first wait signal if the access time of said slow memory circuit exceeds a predetermined amount of time;

(c) count initiating means coupled between said counting means and said first wait signal conductor for responding to said first wait signal to initiate said counting;

(d) interrupt signal producing means responsive to said counting means for producing an interrupt signal in response to attaining of said second count by said counting means and applying said interrupt signal to said processor; and (e) enabled wait signal producing means responsive to said wait enable signal and said first wait signal for producing an enabled wait signal and applying said enabled wait signal to a wait input of said processor;

(f) said processor including means for responding to said interrupt signal by executing a wait interrupt routine resulting in refreshing of all locations of said dynamic random access memory.

2. The system of claim 1 wherein said counting means includes a counter having a load input responsive to said first wait signal for effecting loading of said first count into said counter, a clear input for effecting clearing of said counter, a carry output for producing a carry signal for effecting said producing of said wait enable signal when said second count is contained in said counter, and an enable input for enabling said counter to count.

3. The system of claim 2 wherein said first count and said second count have values such that the time required for said counter to count from said first count to said second count is substantially equal to said predetermined amount of time.

4. The system of claim 2 wherein said count initiating means includes an output coupled to said load input, said counter beginning incrementing if said load input goes from a logical "zero" level to a logical "one" level, said counter loading said first count into said counter if said load input goes from said logical "one" level to said logical "zero" level, said carry output of said counter initially going to a logical "zero" level if said first wait signal goes from a logical "zero" to a logical "one" level.

5. The system of claim 4 wherein said counting means produces said wait enable signal in response to said carry signal.

6. The system of claim 5 wherein said counting means causes said wait enable signal to be at a logical "one" if said carry signal is at a logical "zero" level and at a logical "zero" level if said carry signal is at a logical "one" level.

7. The system of claim 6 wherein said enabled wait signal producing means causes said enabled wait signal to be at a logical "one" level if said access time is substantially less than said predetermined amount of time and at a logical "zero" level if said access time is substantially greater than said predetermined amount of time.

8. The system of claim 7 wherein said counting means produces an enable signal and applies said enable signal to said enable input when said carry signal is present.

9. The system of claim 8 wherein said interrupt signal producing means includes a parallel input-output circuit that produces said interrupt signal.

10. The system of claim 9 wherein said parallel input-output circuit produces a clear signal in response to said interrupt signal, and effects transmitting of said clear signal to said clear input of said counter.

11. A method of operating a system including a dynamic random access memory and a processor which automatically effects transparent refresh operations on said dynamic random access memory during axecution of program instructions in order to ensure timely refreshing of all locations of said dynamic random access memory, said system being capable of accessing a slow memory circuit having the characteristic that it generates a first wait signal if the access time of said slow memory circuit exceeds a first predetermined amount of time, said method comprising the steps of:

(a) accessing a location of said slow memory circuit having an access time that exceeds said first predetermined amount of time, thereby causing said slow memory circuit to generate said first wait signal;

(b) causing said processor to stop or freeze execution of the instruction presently being executed in response to said first wait signal; and (c) if accessing of said location is complete within a second predetermined amount of time, then causing said processor to continue executing said instruction, but otherwise interrupting said processor and causing said processor to execute an interrupt routine which accesses enough addresses of said dynamic random access memory to entirely refresh said dynamic random access memory.

12. The method of claim 11 wherein the execution of the interrupt routine of (c) includes generating an error message to inform an operator that execution of said instruction has been aborted.

13. The method of claim 12 including initiating counting by a wait counter in response to said first wait signal and causing said processor to continue said executing of said first instruction as recited in step (c) only if said wait counter achieves a predetermined count.

* * * * *